United States Patent
Takahashi

(10) Patent No.: US 8,431,829 B2
(45) Date of Patent: Apr. 30, 2013

(54) PRINTED WIRING BOARD AND METHOD FOR MANUFACTURING THE SAME

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 288 days.

(21) Appl. No.: 12/453,632

(22) Filed: May 18, 2009

(65) Prior Publication Data

US 2009/0283312 A1 Nov. 19, 2009

Related U.S. Application Data

(60) Provisional application No. 61/071,790, filed on May 19, 2008.

(51) Int. Cl.
*H05K 1/03* (2006.01)
*H05K 1/11* (2006.01)

(52) U.S. Cl.
USPC ........... 174/255; 174/261; 174/262; 174/266; 361/748; 361/784; 361/785; 361/790; 361/791

(58) Field of Classification Search .................. None
See application file for complete search history.

(56) References Cited

U.S. PATENT DOCUMENTS

| | | | |
|---|---|---|---|
| 6,281,446 B1 | 8/2001 | Sakamoto et al. | |
| 6,799,369 B2 * | 10/2004 | Ochi et al. | 29/852 |
| 7,019,221 B1 | 3/2006 | Noda | |
| 7,345,246 B2 * | 3/2008 | Muramatsu et al. | 174/260 |
| 8,071,883 B2 | 12/2011 | Takahashi et al. | |
| 2002/0020554 A1 | 2/2002 | Sakamoto et al. | |
| 2002/0192485 A1 | 12/2002 | Ochi et al. | |
| 2005/0247481 A1 * | 11/2005 | Chen et al. | 174/261 |

FOREIGN PATENT DOCUMENTS

| | | |
|---|---|---|
| GB | 2 346 740 | 8/2000 |
| JP | 11-317582 | 11/1999 |
| JP | 2000-165007 | 6/2000 |
| JP | 2004-87786 | 3/2004 |
| JP | 3795270 B | 4/2006 |
| JP | 2007-103789 | 4/2007 |
| TW | 200820866 A | 5/2008 |
| TW | 200847363 | 12/2008 |

OTHER PUBLICATIONS

U.S. Appl. No. 12/453,718, filed May 20, 2009, Takahashi.

* cited by examiner

*Primary Examiner* — Jayprakash N Gandhi
*Assistant Examiner* — Dion Ferguson
(74) *Attorney, Agent, or Firm* — Oblon, Spivak, McClelland, Maier & Neustadt, L.L.P.

(57) ABSTRACT

A printed wiring board including a rigid multilayer board, a first substrate having multiple conductors, and a second substrate having multiple conductors electrically connected to the conductors of the first substrate. The conductors of the second substrate have an existing density which is set higher than an existing density of the conductors of the first substrate, and the first substrate and/or the second substrate is embedded in the rigid multilayer board.

20 Claims, 15 Drawing Sheets
(1 of 15 Drawing Sheet(s) Filed in Color)

FIG. 2
(a)
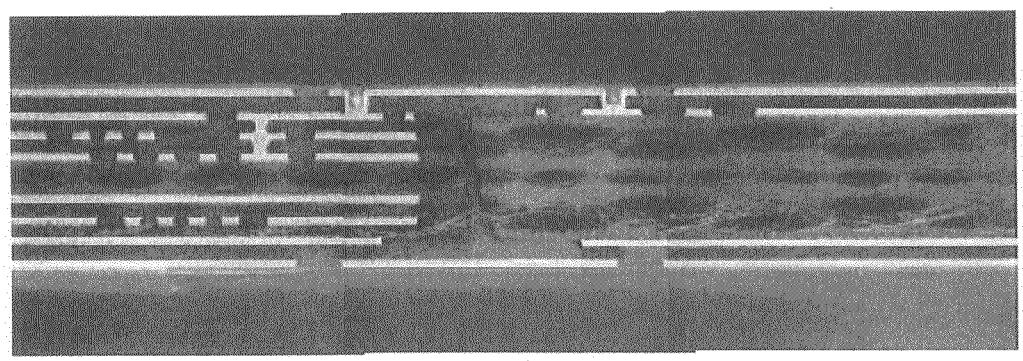
(b)

FIG. 16
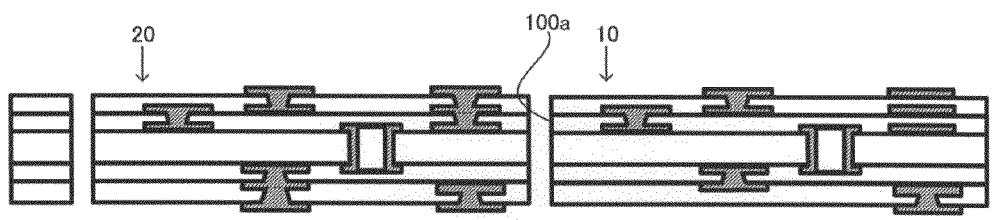
FIG. 17
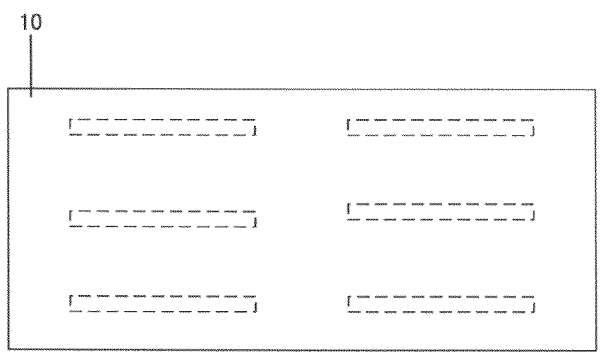
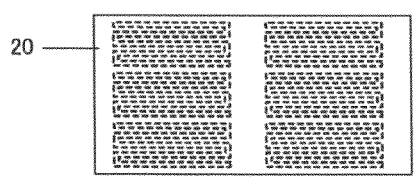
FIG. 18
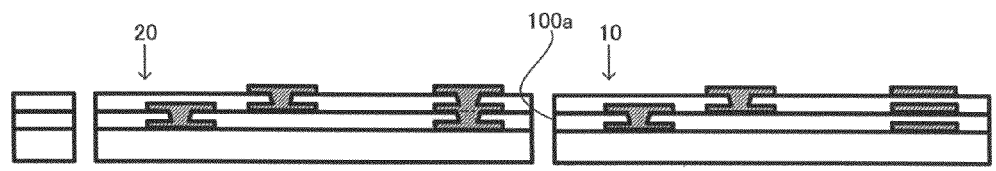

PRINTED WIRING BOARD AND METHOD FOR MANUFACTURING THE SAME

CROSS-REFERENCE TO RELATED APPLICATIONS

The present application claims the benefits of priority to U.S. Application No. 61/071,790, filed May 19, 2008. The contents of that application are incorporated herein by reference in their entirety.

BACKGROUND OF THE INVENTION

1. Field of the Invention

The present invention is related to a printed wiring board and its manufacturing method.

2. Discussion of the Background

A printed wiring board and its manufacturing method are described in, for example, Japanese Patent 3795270. In such a printed wiring board, a high-density region in which conductive bumps are arranged densely, and a low-density region in which conductive bumps are arranged sparsely are both formed in a single substrate. The printed wiring board is structured by properly arranging those high-density regions and low-density regions. The contents of this publication are incorporated herein by reference in their entirety.

SUMMARY OF THE INVENTION

According to one aspect of the present invention, a printed wiring board includes a rigid multilayer board, a first substrate having multiple conductors, and a second substrate having multiple conductors electrically connected to the conductors of the first substrate. The conductors of the second substrate have an existing density which is set higher than an existing density of the conductors of the first substrate, and the first substrate and/or the second substrate is embedded in the rigid multilayer board.

According to another aspect of the present invention, a method for manufacturing a printed wiring board includes providing a first substrate having multiple conductors, forming from a single substrate multiple second substrates each having multiple conductors, forming an accommodation section which accommodates one or more of the second substrates in the first substrate, accommodating one or more of the second substrates in the accommodation section formed in the first substrate, electrically connecting the conductors of the first substrate and the conductors of one or more of the second substrates, and embedding one or more of the second substrates by laminating a predetermined material on the first substrate and one or more of the second substrates accommodated in the first substrate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

A more complete appreciation of the invention and many of the attendant advantages thereof will be readily obtained as the same becomes better understood by reference to the following detailed description when considered in connection with the accompanying drawings, wherein:

FIGS. 2 (a)-(b) are photographs schematically showing a structure of the printed wiring board;

FIG. 16 is a cross-sectional view illustrating a modified example of a first substrate;

FIG. 17 includes plan views illustrating modified examples of a first substrate and a second substrate;

FIG. 18 is a cross-sectional view illustrating a modified example of a first substrate and a second substrate;

DETAILED DESCRIPTION OF THE EMBODIMENTS

Figure 1:
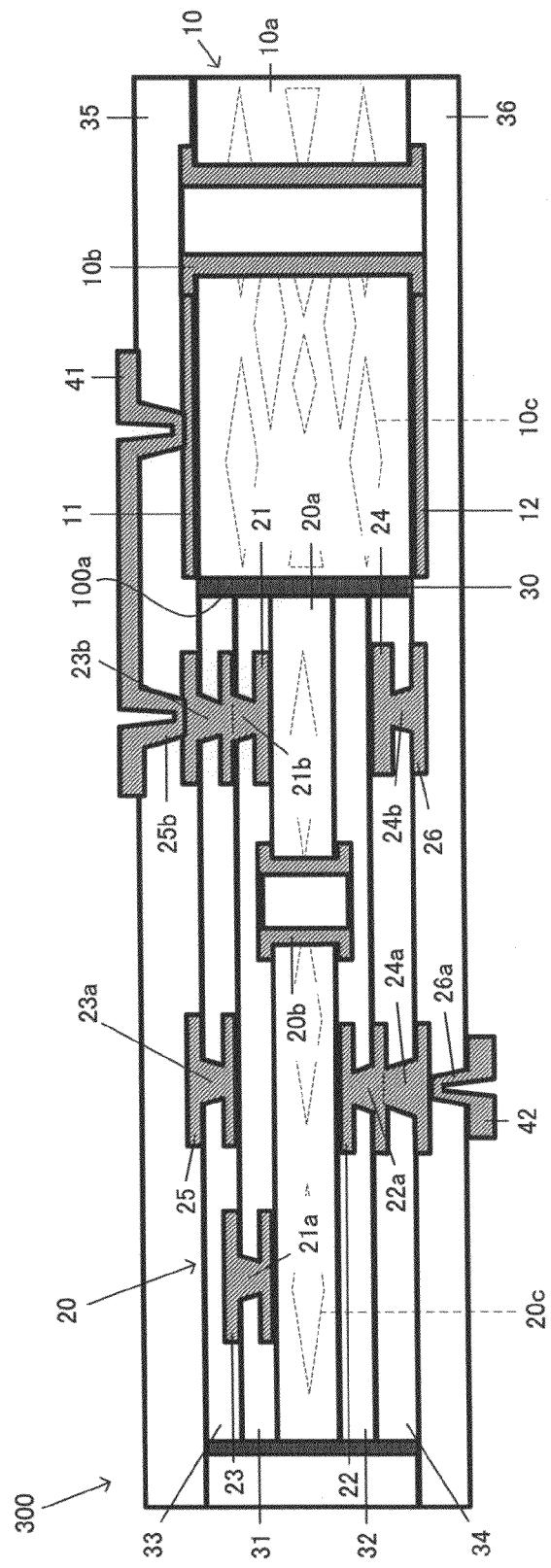
FIG. 1 is a cross-sectional view schematically illustrating a structure of a printed wiring board according to an embodiment of a printed wiring board of the present invention and its manufacturing method.

The embodiments will now be described with reference to the accompanying drawings, wherein like reference numerals designate corresponding or identical elements throughout the various drawings.

Printed wiring board 300 according to an embodiment of the present invention, for example, as its cross-sectional structure shows in FIG. 1 and its cross-sectional photographs show in FIGS. 2(a) and 2(b), has first substrate 10, second substrate 20 embedded in printed wiring board 300, insulative materials 35, 36 disposed on the top and bottom of first substrate 10 and second substrate 20, and wiring layers 41, 42. Printed wiring board 300 is a so-called rigid multilayer board. Also, first substrate 10 and second substrate 20 structuring printed wiring board 300 are each multilayer printed wiring boards.

First substrate 10 has, for example, non-flexible base material (10a) (which corresponds to a core substrate of printed wiring board 300) containing inorganic material (such as glass cloth, silica filler or glass filler). As shown with broken lines in FIG. 1, non-flexible base material (10a) has cloth layer (10c) made with inorganic material. Also, on the top and bottom of first substrate 10, wiring layers 11, 12 made of conductor (such as copper) are patterned respectively. Furthermore, for example, by plating through-holes with copper or the like, penetrating connectors (10b) are formed to connect the conductive patterns on the top and bottom of the substrate.

Second substrate 20 has non-flexible base material (20a) containing inorganic material (such as glass cloth, silica filler or glass filler). Non-flexible base material (20a) corresponds to the core substrate of second substrate 20 and its thickness is made smaller (thinner) than the thickness of first substrate 10, and as shown with broken lines in FIG. 1, it has cloth layer (20c) made with inorganic material. Moreover, formed on the top and bottom of non-flexible base material (20a), are insulative materials 31-34, wiring layers 21-26 made of conductive patterns (such as copper patterns), and interlayer connection portions (21a, 21b, 22a, 23a, 23b, 24a, 24b) which electrically connect each wiring layer. More specifically, on top and bottom of base material (20a), wiring layers 21, 22 are formed; and wiring layers 21, 22 are electrically connected to upper-layer wiring layers 23, 24 by means of interlayer connection portions (21a, 21b, 22a) made of, for example, copper, formed in insulative materials 31, 32 which insulate the interlayer between them and their upper layers. Furthermore, wiring layers 23, 24 are electrically connected to upper-layer wiring layers 25, 26 by means of interlayer connection portions (23a, 23b, 24a, 24b) made of, for example, copper, formed in insulative materials 33, 34 which insulate the interlayer between them and their upper layers. Accordingly, each wiring layer is electrically connected to the other. Also, in base material (20a), penetrating connectors (20b) which connect the conductive patterns on top and bottom of the base material are formed by, for example, through-hole plating with copper or the like.

Resin 30 is filled between first substrate 10 and second substrate 20. Namely, first substrate 10 and second substrate 20 are physically connected and adhered (electrically insulated) to each other by means of resin 30. Resin 30 may be formed with the same material as the resin that makes upper-layer insulative materials 35, 36.

As described, by connecting first substrate 10 and second substrate 20 through resin 30, adhesiveness between first substrate 10 and second substrate 20 is enhanced. Also, filled resin 30 works as a shock absorber, and when an impact is exerted from the outside, the impact will not be passed along to second substrate 20. Thus, connection reliability of the wiring in second substrate 20, whose wiring density is higher than that of first substrate 10, may be enhanced. In addition, by embedding second substrate 20 which is separately produced, a complex build-up process may be simplified. Furthermore, since insulation layers of first substrate 10 have higher rigidity than insulation layers of second substrate 20, stress exerted on second substrate 20 may be eased.

First substrate 10 and second substrate 20 are set to have the same thickness as each other, and their uppermost layers, wiring layers 11, 12 and wiring layers 25, 26, are formed on the same layer. Namely, the number of wiring layers in a unit thickness of second substrate 20 (six: wiring layers 21-26) is set greater than the number of wiring layers in a unit thickness of first substrate 10 (two: wiring layers 11, 12). When the number of wiring layers is compared in a region having the same thickness in both substrates (a number of wiring layers within a given thickness (a certain thickness as a unit, "a unit thickness")), second substrate 20 has a higher existing density of conductors than first substrate 10 (namely, in the end, substrate 300 containing both substrates). As such, in the printed wiring board, the number of wiring layers formed by the conductors in second substrate 20 is made greater than the number of wiring layers in a region of first substrate 10 that has the same thickness as second substrate 20. With such a structure, a high-density conductor region may be formed easily, and thus it may be easier to make part of the printed wiring board fine-pitched.

Also, the thickness of at least parts of the wiring layers (conductive circuits) of second substrate 20 is the same as the thickness of a conductive circuit of first substrate 10. However, the thickness of at least parts of the conductive circuits of second substrate 20 may be thinner than the thickness of a conductive circuit of first substrate 10.

Insulative materials 35, 36 are made with, for example, an RCF (Resin Coated Cupper foil) (or a prepreg may also be used). On their surfaces, wiring layers 41, 42 are formed respectively and are electrically connected to lower-layer wiring layers 11, 12, 25, 26 by means of interlayer connection portions (25b, 26a). Through wiring layers 41, 42, first substrate 10 and second substrate 20 are electrically connected.

Figure 3:
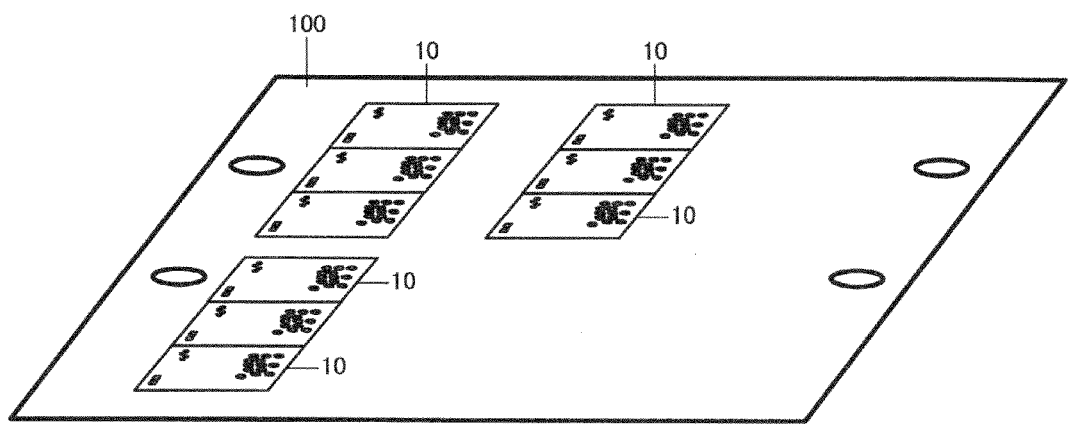
FIG. 3 is a perspective view illustrating a production step of first substrates according to the manufacturing method of the embodiment.
Figure 4:
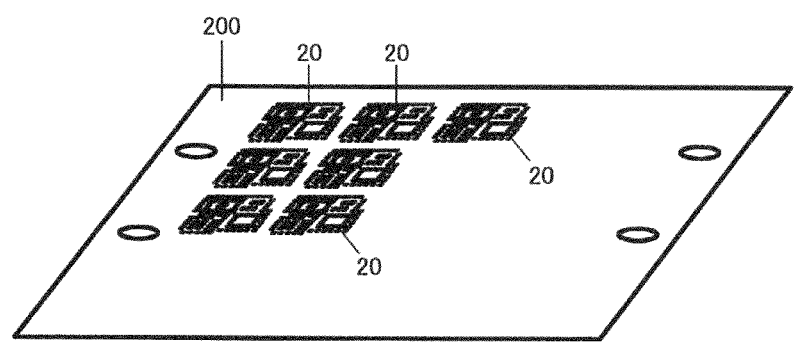
FIG. 4 is a perspective view illustrating a production step of second substrates according to the manufacturing method of the embodiment.

When manufacturing such printed wiring boards, for example, as shown in FIGS. 3 and 4, a sufficient number (for example, approximately 32) of first substrates 10 are formed on a single substrate 100 and a sufficient number (for example, approximately 96) of second substrates 20 on a single substrate 200, using a series of semiconductor processes different from each other.

Figure 5:
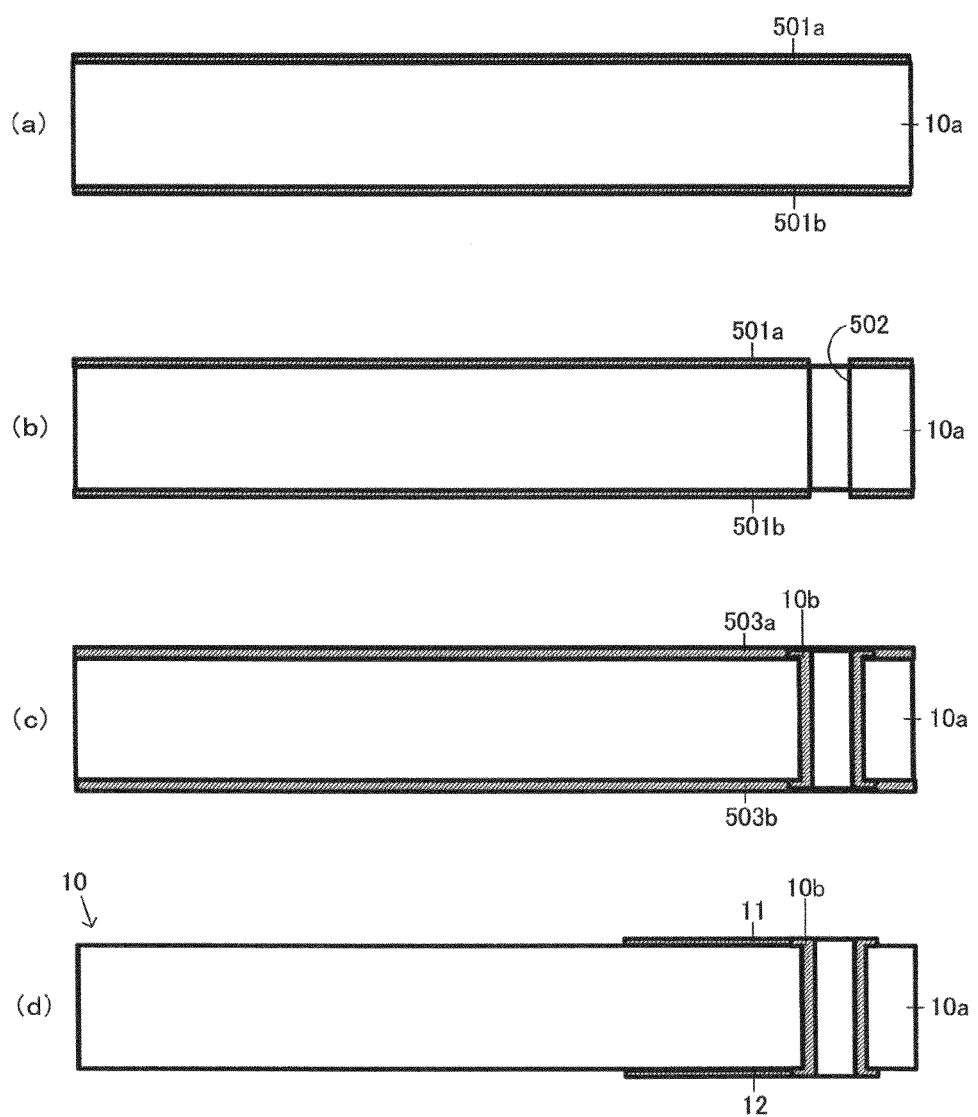
FIGS. 5 (a)-(d) are cross-sectional views illustrating production steps of a first substrate according to the manufacturing method of the embodiment.

Specifically, when producing first substrate 10, as shown in FIG. 5(a), for example, non-flexible base material (10a) having copper foils (501a, 501b) respectively on its top and bottom is prepared. Then, as shown in FIG. 5(b), for example, penetrating holes 502 are formed by a piercing process. After that, the substrate is polished and as shown in FIG. 5(c), for example, by performing PN plating (such as chemical copper plating and electrical copper plating), penetrating connectors (10b) are formed which connect the conductive patterns on the top and bottom of the substrate, and conductive films (503a, 503b) made of copper, for example, are also formed respectively on the top and bottom of non-flexible base material (10a). Then, conductive films (503a, 503b) are each patterned by a predetermined photo-etching process (such as washing with acid, laminating a resist, direct drawing (exposing to light), developing, etching, removing the film and so forth) to form wiring layers 11, 12 as shown in FIG. 5(d), for example. Accordingly, first substrate 10 having wiring layers 11, 12 is produced.

Figure 6:
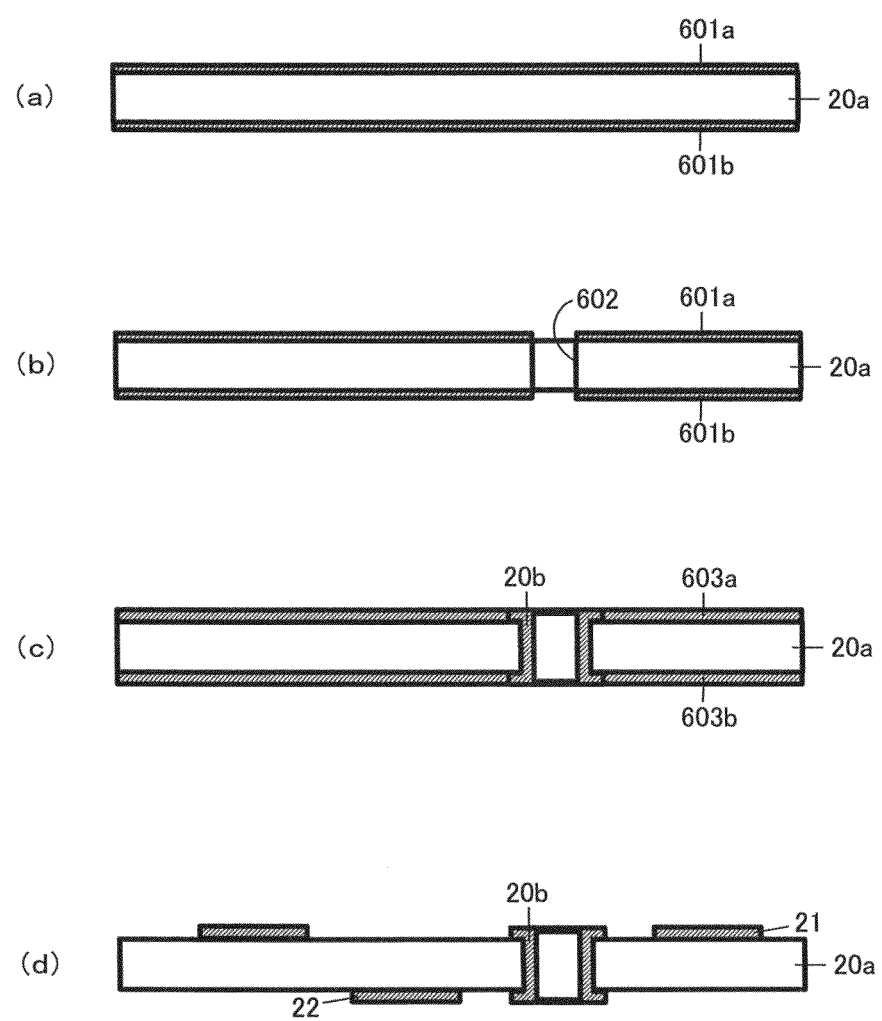
FIGS. 6(a)-(d) are cross-sectional views illustrating production steps of a first wiring layer of a second substrate according to the manufacturing method of the embodiment.

Also, when producing second substrate 20, as shown in FIG. 6(a), for example, non-flexible base material (20a) having copper foils (601a, 601b) on its top and bottom is prepared. Then, as shown in FIG. 6(b), for example, penetrating holes 602 are formed by a piercing process. After that, the substrate is polished and as shown in FIG. 6(c), for example, by performing PN plating (such as chemical copper plating and electrical copper plating), penetrating connectors (20b) are formed which connect the conductive patterns on the top and bottom of the substrate, and conductive films (603a, 603b) made of copper, for example, are also formed respectively on the top and bottom of non-flexible base material (20a). Then, conductive films (603a, 603b) are each patterned by a predetermined photo-etching process (such as washing with acid, laminating a resist, direct drawing (exposing to light), developing, etching, removing the film and so forth) to form wiring layers 21, 22 as shown in FIG. 6(d), for example. Accordingly, the first wiring layers of second substrate 20 are produced. Then, an inspection using an image checker or the like is performed and a black oxide treatment is further conducted before starting to form upper-layer second wiring layers.

Figure 7:
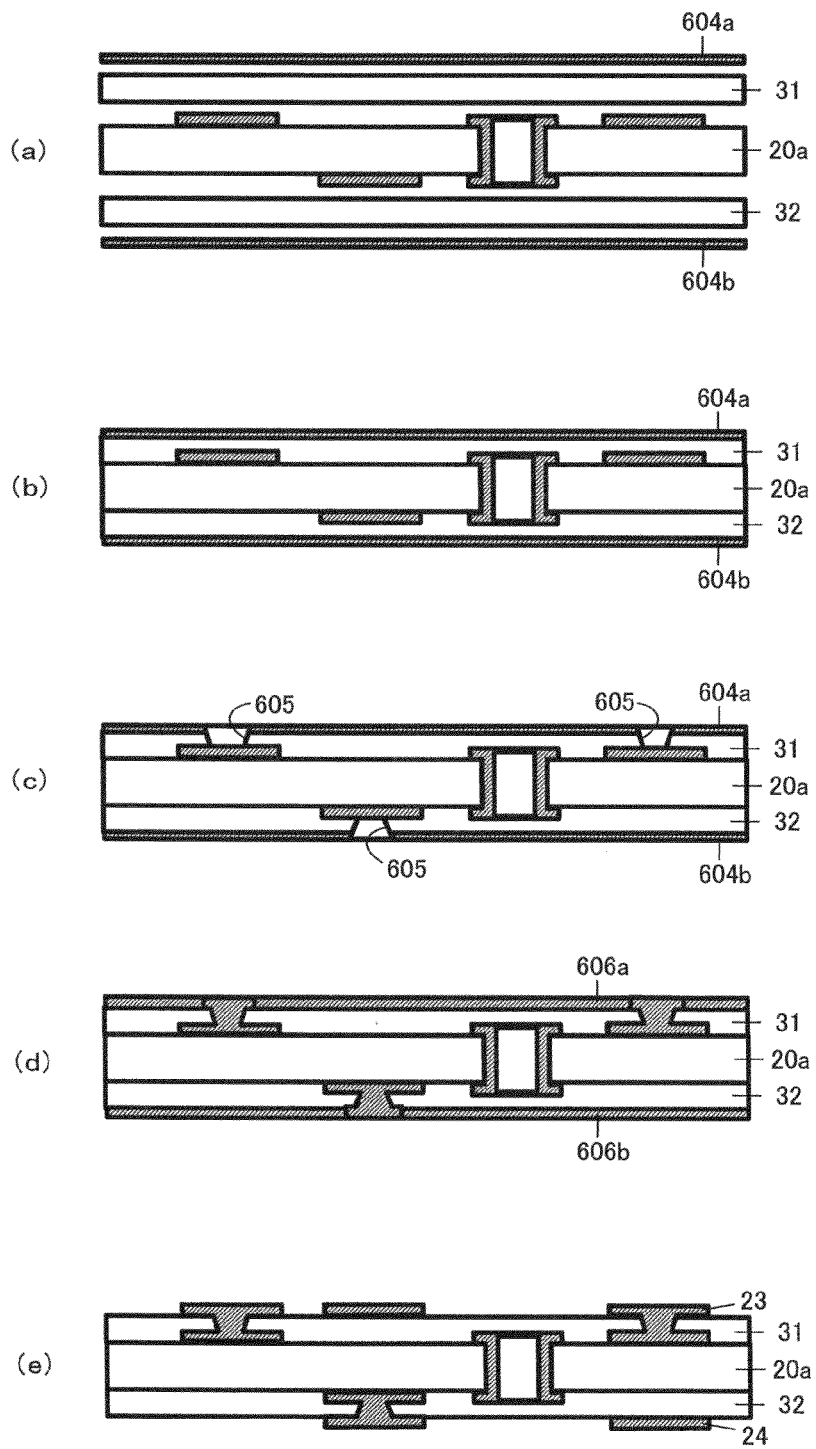
FIGS. 7 (a)-(e) are cross-sectional views illustrating production steps of a second wiring layer of a second substrate according to the manufacturing method of the embodiment.

When forming second wiring layers, as shown in FIG. 7(a), for example, on the top and bottom of the structure having the first wiring layers formed above, insulative materials 31, 32 made with prepreg, for example, and conductive films (604a, 604b) made of copper foil, for example, are disposed respectively. Then, using, for example, hydraulic pressing equipment, pressure is exerted on outermost conductive films (604a, 604b) to pressure-press the entire structure as shown in FIG. 7(b), for example.

Next, after trimming (edge cutting and marking), drilling a hole for alignment, soft etching and conducting a laser pre-treatment, vias 605 are formed using a laser, for example, as shown in FIG. 7(c). Furthermore, after conducting desmear (removing smears) and soft etching, conductors (606a, 606b) are formed as shown in FIG. 7(d), for example, on the top and bottom of the structure by performing PN plating (such as chemical copper plating and electrical copper plating). Then, after conductors (606a, 606b) are formed, a process inspection is conducted to see whether there are any dents.

In the following, conductive films (606a, 606b) are each patterned through a predetermined photo-etching process (such as washing with acid, laminating a resist, direct drawing (exposing to light), developing, etching, removing the film and so forth), and wiring layers 23, 24 are formed, for example, as shown in FIG. 7(e). In doing so, the second wiring layers of second substrate 20 are also formed. Then, an inspection using an image checker or the like and a black oxide treatment are conducted to start forming further upper-layer third wiring layers.

Figure 8:
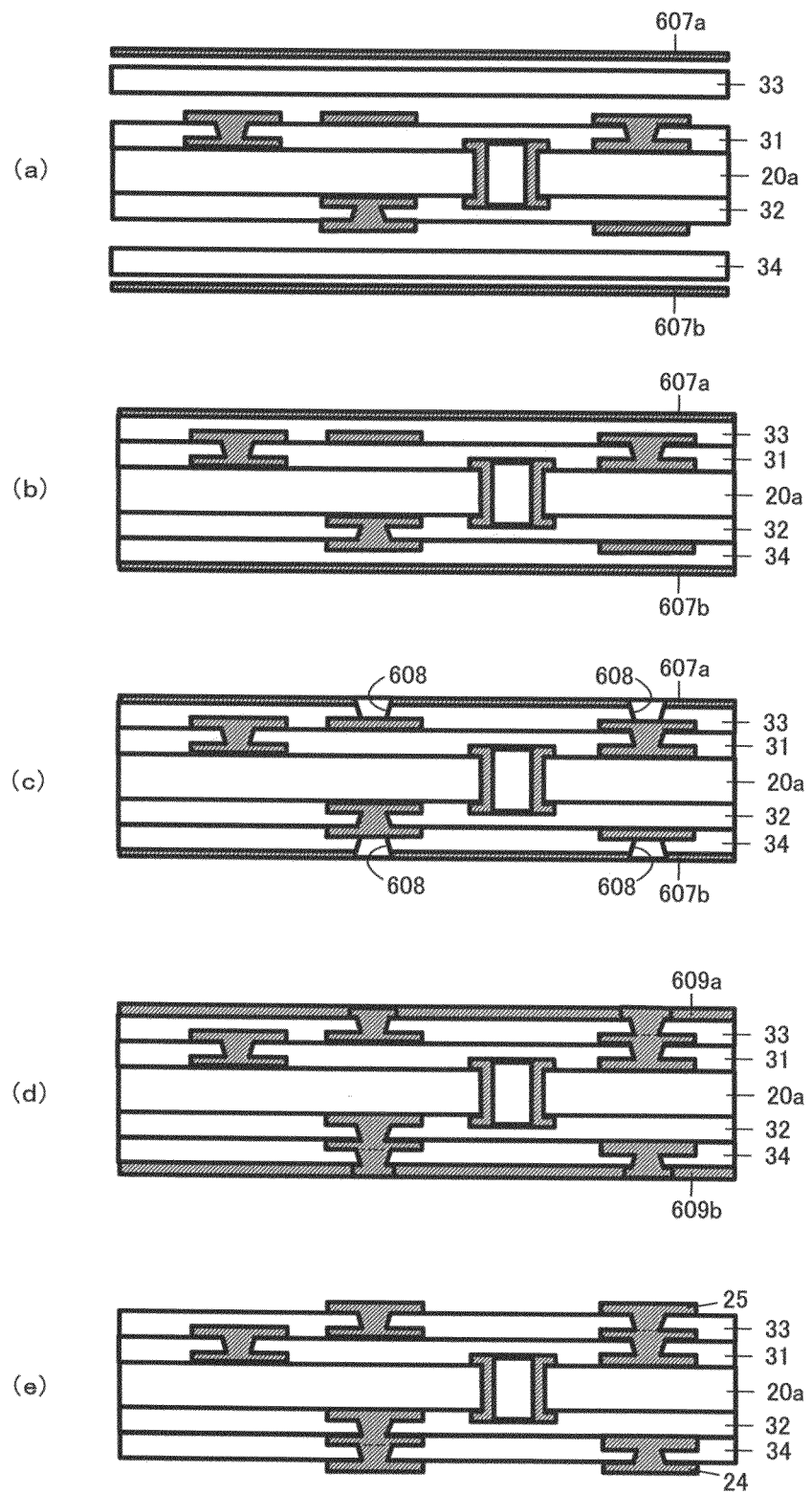
FIGS. 8 (a)-(e) are cross-sectional views illustrating production steps of a third wiring layer of a second substrate according to the manufacturing method of the embodiment.

When forming third wiring layers, as shown FIG. 8(a), for example, on the top and bottom of the structure having the first and second wiring layers formed above, insulative materials 33, 34 made with, for example, prepreg, and conductive films (607a, 607b) made of, for example, a copper foil, are disposed respectively. Then, using, for example, hydraulic pressing equipment, pressure is exerted on outermost conductive films (607a, 607b) to pressure-press the entire structure as shown in FIG. 8(b), for example.

Next, after trimming (edge cutting and marking), drilling a hole for alignment, soft etching and conducting a laser pre-treatment, vias 608 are formed using a laser, for example, as shown in FIG. 8(c). Furthermore, after conducting desmear (removing smears) and soft etching, conductors (609a, 609b) are formed respectively on the top and bottom of the structure as shown in FIG. 8(d), for example, by performing PN plating (such as chemical copper plating and electrical copper plating). Then, after conductors (609a, 609b) are formed, a process inspection is conducted to see if there are any dents.

In the following, conductive films (609a, 609b) are each patterned through a predetermined photo-etching process (such as washing with acid, laminating a resist, direct drawing (exposing to light), developing, etching, removing the film and so forth), and wiring layers 25, 26 are formed, for example, as shown in FIG. 8(e). In doing so, the third wiring layers of second substrate 20 are also formed and second substrate 20 is completed.

After producing first substrate 10 and second substrate 20 as above, all the substrates 10, 20 formed on substrate 100 and substrate 200 are inspected for quality to determine which substrates are defect-free and which substrates are flawed (defective). Substrates 10, 20 determined as defective here are abandoned according to requirements. When inspecting substrates 10, 20, an inspection using, for example, an image checker or the like is conducted. Then, substrates 10, 20 are each further processed by a black-oxide treatment.

Figure 9:
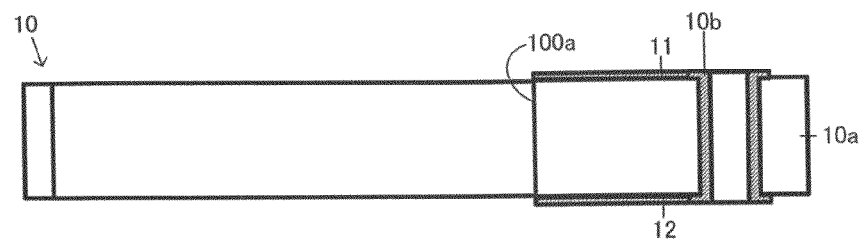
FIG. 9 is a cross-sectional view illustrating a step to form an accommodation section in a first substrate.

Next, as shown in FIG. 9, first substrate 10 on substrate 100 is cut by a laser (laser cutting), for example, to form accommodation section (100a) which is a space to accommodate a predetermined number (which is one, here) of second substrate 20. Accommodation section (100a) is set to have a configuration (such as a rectangular hollow space) and a size with sufficient space to allow alignment when second substrate 20 is accommodated.

Figure 10:
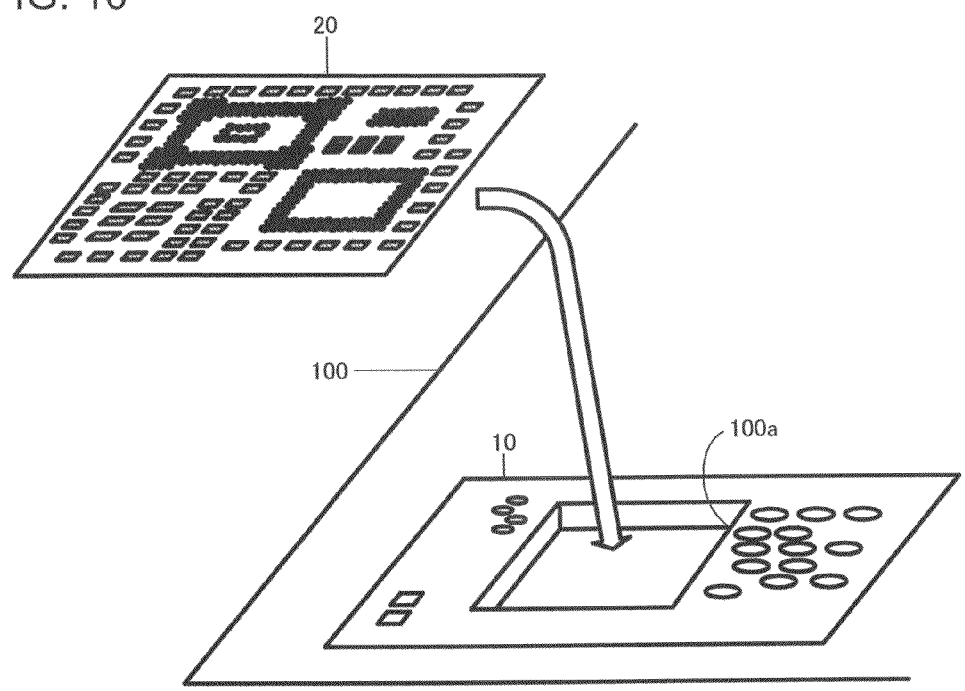
FIG. 10 is a perspective view illustrating a step to accommodate a second substrate in an accommodation section of a first substrate.
Figure 11:
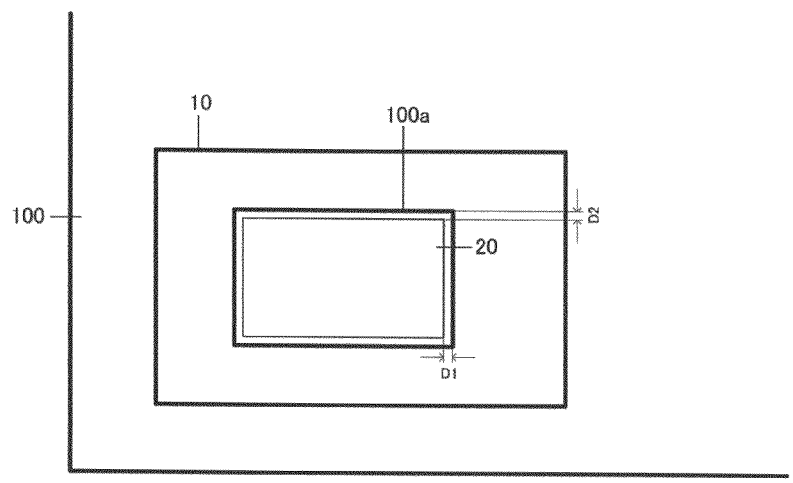
FIG. 11 is a plan view illustrating a phase in which a second substrate is accommodated in an accommodation section.
Figure 12:
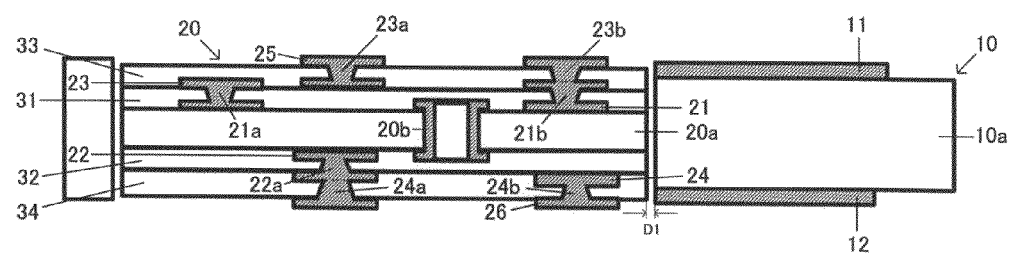
FIG. 12 is a cross-sectional view illustrating a phase in which a second substrate is accommodated in an accommodation section.

In the following, second substrate 20 determined as defect-free in the above inspection is cut out from single substrate 200 using a laser, for example, as a chip with a predetermined size as shown in FIG. 10. Then, as a plan view and a cross-sectional view shown in FIGS. 11 and 12 respectively, for example, a chip of second substrate 20 is accommodated in accommodation section (100a). Then, using sheet-type deposition equipment, a hot-melting adhesive agent is melted to temporarily deposit both substrates (for example, four units). During that process, since accommodation section (100a) has a hollow configuration corresponding to the external form of second substrate 20, namely, a hollow configuration which is made larger than second substrate 20 by predetermined gaps (D1, D2) (each is a small gap with a size sufficient to allow the position of second substrate 20 to be adjusted), second substrate 20 may be aligned in a predetermined position (where accommodation section (100a) is positioned).

When filling resin 30 in gaps (D1, D2), an adhesive agent may be poured using, for example, a dispenser. Alternatively, an adhesive agent may be applied in accommodation section (100a) beforehand, and a chip of second substrate 20 may be accommodated in accommodation section (100a).

Figure 13:
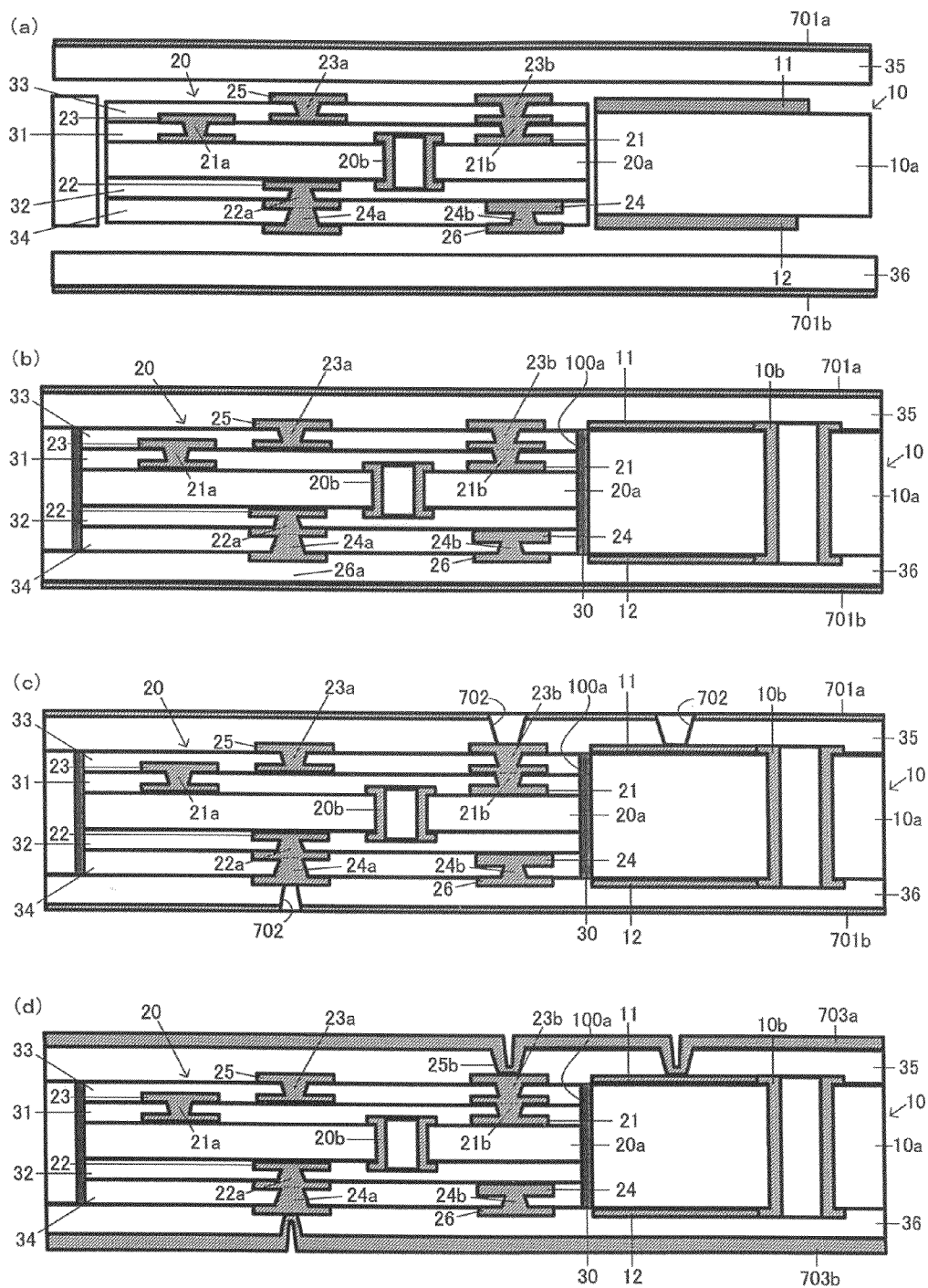
FIGS. 13 (a)-(d) are cross-sectional views illustrating steps for manufacturing a printed wiring board after a second substrate has been accommodated in an accommodation section.

Next, on the top and bottom of the structure, insulative material 35 made with, for example, an RCF having copper foil (701a) on its surface and insulative material 36 made with, for example, an RCF having copper foil (701b) on its surface are disposed respectively, for example, as shown in FIG. 13(a). Then, using, for example, hydraulic pressing equipment, outermost-layer conductive films (701a, 701b) are pressed to pressure-press the entire structure as shown in FIG. 13(b), for example. Through the pressing, resin is squeezed out from insulative materials 35, 36, and resin 30 is filled in gaps (D1, D2) (FIG. 11) between second substrate 20 and accommodation section (100a). As described above, since insulative materials 35, 36 are arranged on the top and bottom of resin 30, and the resin that forms insulative materials 35, 36 and resin 30 are made of the same material, resin 30 may be easily formed (filled) in gaps (D1, D2) by using insulative materials 35, 36.

Next, after trimming (edge cutting and marking), drilling a hole for alignment, soft etching and conducting a laser pre-treatment, vias 702 are formed using a laser or the like, for example, as shown in FIG. 13(c). Furthermore, after conducting desmear (removing smears) and soft etching, conductive films (703a, 703b) are formed, for example, as shown in FIG.

13(d), on the top and bottom of the structure by performing PN plating (such as chemical copper plating and electrical copper plating). Then, conductive films (703a, 703b) are patterned, for example, by a predetermined photo-etching process (such as washing with acid, laminating a resist, direct drawing (exposing to light), developing, etching, removing the film and so forth) to form wiring layers 41, 42 as shown in FIG. 1. Accordingly, printed wiring board 300 is completed.

Figure 14:
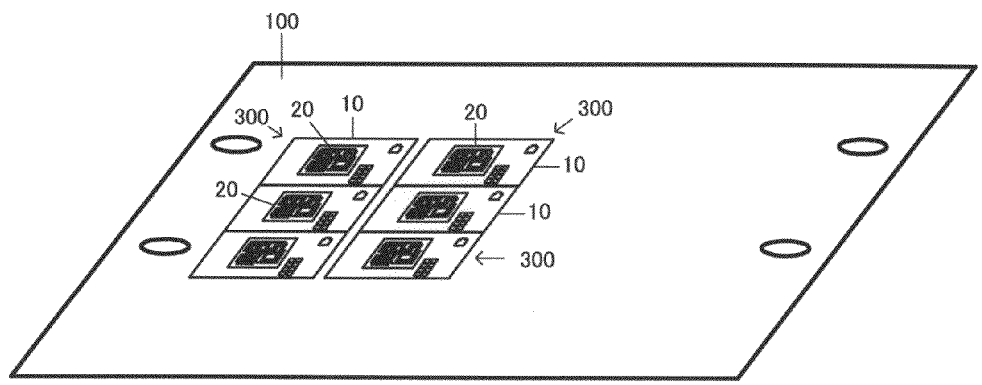
FIG. 14 is a perspective view illustrating a substrate where multiple printed wiring boards according to an embodiment of the present invention are formed.

As shown in FIG. 14, multiple printed wiring boards 300 are also formed on a single substrate so as to correspond to the number of first substrates 10 and second substrates 20. Namely, by cutting out such printed wiring boards as chips, each chip will make a product. By making such a structure, the number of wiring layers of printed wiring board 300 lowers, thus reducing unnecessary portions for connecting conductors. Accordingly, its tolerance to impact from being dropped is enhanced.

The above embodiment may be practiced after being modified as follows.

Figure 15:
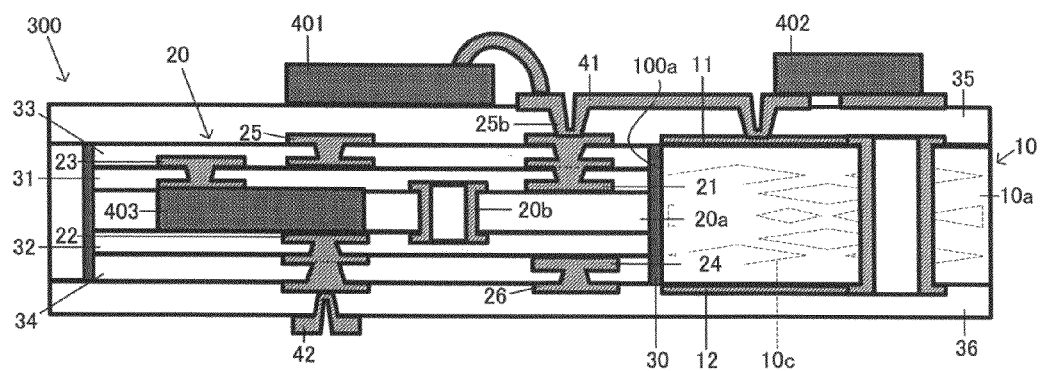
FIG. 15 is a cross-sectional view illustrating a modified example of a printed wiring board.

At least either first substrate 10 or second substrate 20 may be connected to at least one electronic component. For example, as shown in FIG. 15, using wire bonding, flip-chip mounting or the like, electronic components 401, 402 are mounted on the surface of printed wiring board 300 to electrically connect them by means of, for example, LPSR, gold wiring or the like to first substrate 10 and second substrate 20 respectively; or as electronic component 403 is shown in the drawing, an electronic component may be directly connected to second substrate 20, where it is embedded. Instead of laminating second substrate 20 but by producing it separately and embedding it in printed wiring board 300, a substrate with such a complex structure may be easily manufactured. Here, the number of electronic components is optional.

The second substrates, with a higher existing density of conductors than the first substrate, are not limited to those having a greater number of wiring layers per unit thickness than the first substrate. As shown in FIG. 16, for example, even when the number of wiring layers per unit thickness is the same in both substrates, second substrate 20 may be formed in such a way that the number of vias per interlayer insulation layer is greater than in first substrate 10. Here, vias are holes (holes for interlayer connection) that are formed in an interlayer insulation layer to electrically connect the lower-layer wiring layer and the upper-layer wiring layer; IVHs and others, such as plated through-holes, plated microvias, or conductive-paste coated connection holes may be employed. Furthermore, even if the number of wiring layers and the number of vias are the same, as shown in FIG. 17, for example, the existing density of conductors on an insulation layer in second substrate 20 may be made greater than the existing density of conductors on an insulation layer in first substrate 10. The thickness of the core substrate of second substrate 20 may be set the same as the thickness of first substrate 10 (for example, see FIG. 16). Also, as shown in FIG. 18, first substrate 10 and second substrate 20 may have conductors (wiring layers) only on either the top or the bottom of the core substrate.

Figure 19:
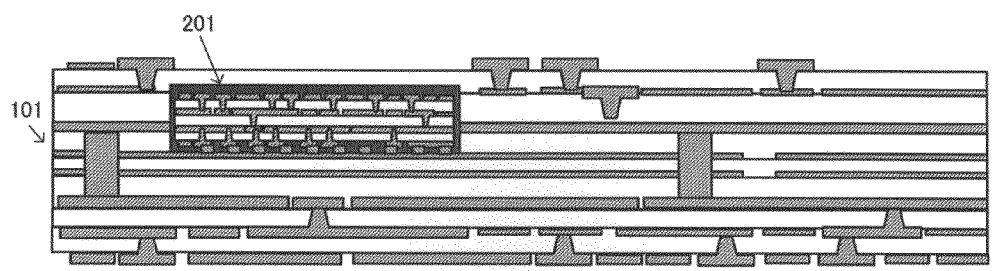
FIG. 19 is a cross-sectional view illustrating a modified example of a printed wiring board.

In the above embodiment, first substrate 10 and second substrate 20 are electrically connected through upper-layer wiring layers. However, they are not limited to such; the method for connecting both substrates is optional. For example, as shown in FIG. 19, a second substrate (substrate 201 with a higher conductor density) may be electrically connected using a flip-chip method to the first substrate (substrate 101 with a lower conductor density).

Figure 20:
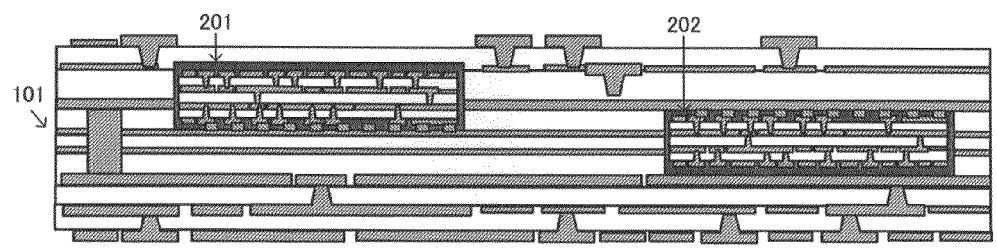
FIG. 20 is a cross-sectional view illustrating another modified example of a printed wiring board.
Figure 21:
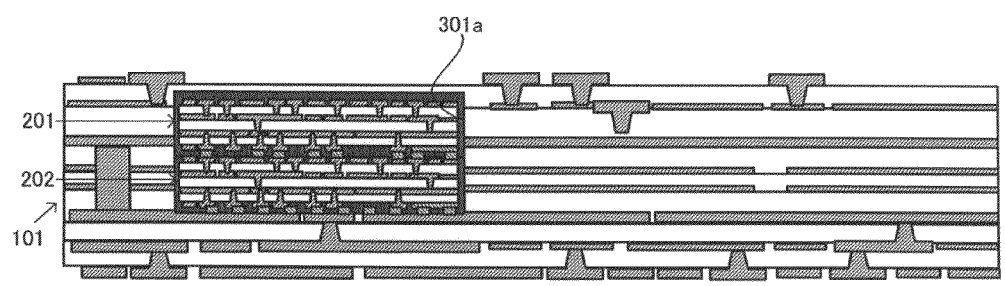
FIG. 21 is a cross-sectional view illustrating yet another modified example of a printed wiring board.

Multiple second substrates may be embedded in one first substrate. For example, as shown in FIG. 20, in a printed wiring board having a first substrate (substrate 101 with a lower conductor density), two second substrates (substrates 201, 202 with a higher conductor density) may be embedded. Alternatively, as shown in FIG. 21, multiple second substrates (in this example, two: substrates 201, 202) may be accommodated in one accommodation section (301a).

Figure 22:
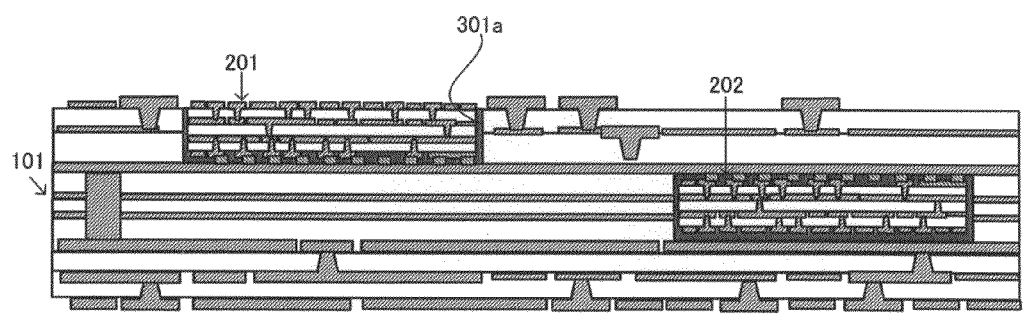
FIG. 22 is a cross-sectional view illustrating yet another modified example of a printed wiring board.

Furthermore, as shown in FIG. 22, without embedding, substrate 201 with a higher conductor density is arranged in hollow section (accommodation section) (301a) formed at a surface of the printed wiring board. A printed wiring board may be formed by combining such substrate 201 and second substrate 202 embedded in the printed wiring board. Having such a structure, a high-density conductor region may be easily formed on the substrate surface as well as inside the substrate.

The material for first substrate 10 and second substrate 20 is optional. Substrates 10, 20 may be made with the same material or with different materials.

Figure 23:
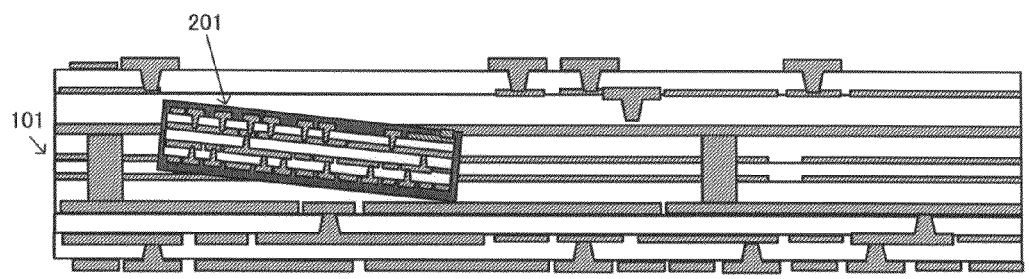
FIG. 23 is a cross-sectional view illustrating yet another modified example of a printed wiring board.

The configuration, position and its posture at the position of second substrate 20 may also be optional. For example, as shown in FIG. 23, a second substrate (substrate 201 with a higher conductor density) may be set inclined in the first substrate (substrate 101 with a lower conductor density). Also, a roughened surface may be formed in a second substrate, or a second substrate itself may be formed in a V-shape.

In the above embodiment, accommodation section (100a) is formed after inspecting first substrate 10 and second substrate 20. However, each substrate may be inspected after forming accommodation section (100a).

The configuration and size of accommodation section (100a) are optional. However, considering the alignment of second substrate 20, its configuration and size are preferred to correspond to second substrate 20.

Figure 24:
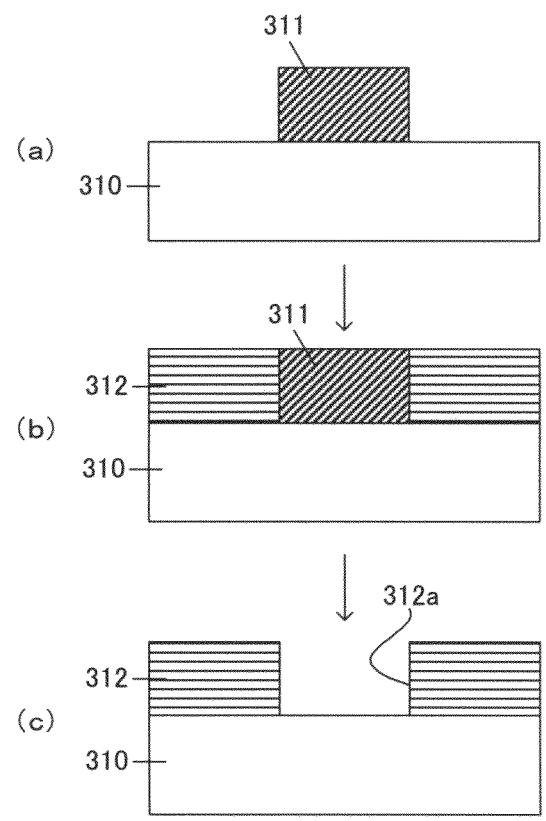
FIGS. 24 (a)-(c) are cross-sectional views illustrating a modified example of a method for manufacturing a printed wiring board.

Forming an accommodation section is not limited to a method in which a portion corresponding to its space is removed by a laser or the like. For example, accommodation section (312a) may also be formed as follows: sacrificial material 311 is formed on substrate 310 beforehand as shown in FIG. 24(a), and multilayer film 312 (multilayer in this example, but a single layer may also be employed) is formed as shown in FIG. 24(b), then, sacrificial material 311 is removed by selective etching or the like after the film was formed as shown in FIG. 24(c).

A printed wiring board according to the first aspect of the present invention has a first substrate having conductors and one or more second substrates having conductors whose existing density is set higher than that of the first substrate. It includes the following: the conductors of the first substrate and the conductors of a second substrate are electrically connected; and at least either the first substrate or a second substrate is embedded in the printed wiring board.

The structure may also be formed in such a way that the number of wiring layers formed by the conductors in a second substrate is set greater than the number of wiring layers in a region of the first substrate that has the same thickness as a second substrate.

The structure may also be formed in such a way that the first substrate and a second substrate each have insulation layers; and the existing density of conductors on insulation layers of a second substrate is set higher than the existing density of conductors on insulation layers of the first substrate.

The structure may also be formed in such a way that the first substrate and a second substrate have a lower-layer wiring layer and an upper-layer wiring layer that are electrically connected through vias in an interlayer insulation layer; and the number of vias per interlayer insulation layer in a second substrate is set greater than the number of vias per interlayer insulation layer in the first substrate.

The structure may also be formed in such a way that the first substrate and a second substrate are positioned without touching each other; and resin is present in at least part of the gap between the first substrate and a second substrate.

The structure may also be formed in such a way that an insulative material is disposed on at least either the top or the bottom of the resin; and the resin that forms the insulative material and the resin in the gap between the first substrate and a second substrate are made of the same material.

The structure may also be formed in such a way that at least either the first substrate or a second substrate has an insulation layer containing inorganic material.

The structure may also be formed in such a way that at least either an insulation layer in the first substrate or an insulation layer in a second substrate has at least a cloth layer made with the inorganic material.

The structure may also be formed in such a way that the number of insulation layers containing inorganic material in the first substrate is set greater than the number of insulation layers containing inorganic material in a second substrate.

The structure may also be formed in such a way that the thickness of at least parts of conductors in a second substrate is set the same as or less than the thickness of the conductors in the first substrate.

The structure may also be formed in such a way that at least one electronic component is electrically connected to at least either the first substrate or a second substrate.

The structure may also be formed in such a way that at least one electronic component is electrically connected to a second substrate.

A method for manufacturing a printed wiring board according to the second aspect of the present invention may have a first step to produce a first substrate having conductors; a second step to produce on a single substrate a sufficient number of second substrates; a third step to form an accommodation section which is a space in the first substrate produced in the first step to accommodate a second substrate; a fourth step to accommodate one or more of the second substrates in the accommodation section formed in the third step; a fifth step to electrically connect the conductors of the first substrate and the conductors of a second substrate; and a sixth step to embed a second substrate by laminating a predetermined material on the second substrate accommodated in the fourth step and on the first substrate which accommodates the second substrate.

Prior to the fourth step, a substrate inspection step may be conducted to check the quality of the first substrate produced in the first step and the second substrates produced in the second step. Then, in the fourth step, one or more of the second substrates determined to be defect-free in the substrate inspection step may be accommodated in the accommodation section of the first substrate determined to be defect-free in the substrate inspection step.

In the third step, the accommodation section may be formed in such a way that it has sufficient space to allow alignment when accommodating a second substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising: a first substrate having a plurality of conductors including a conductor layer formed on a surface of the first substrate; a second substrate having a plurality of conductors including a conductor layer formed on a surface of the second substrate; an insulation layer comprising an insulative material and formed over the first substrate and the second substrate such that the insulation layer covers the conductor layers formed on the surfaces of the first and second substrates; and a wiring layer formed on the insulation layer and having a plurality of interlayer connection portions formed through the insulation layer such that the conductor layers formed on the surfaces of the first and second substrates are directly and electrically connected through the wiring layer, wherein the conductors of the second substrate have an existing density which is set higher than an existing density of the conductors of the first substrate, the first substrate has an accommodation section configured to accommodate the second substrate, the insulation layer is formed over the first substrate and the second substrate such that the second substrate is embedded in the accommodation section of the first substrate, the insulation layer has a plurality of vias formed through the insulation layer, and the interlayer connection portions of the wiring layer are formed in the vias, respectively.

2. The printed wiring board according to claim 1, wherein the plurality of conductors in the second substrate has a number of wiring layers formed by the conductors in the second substrate which is set greater than a number of wiring layers formed by the plurality of conductors in a region of the first substrate that has a same thickness as a second substrate.

3. The printed wiring board according to claim 1, wherein the first substrate and the second substrate have a plurality of insulation layers, respectively, and the conductors on the insulation layers of the second substrate have an existing density which is set higher than an existing density of the conductors on the insulation layers of the first substrate.

4. The printed wiring board according to claim 1, wherein the first substrate and the second substrate each have a lower-layer wiring layer and an upper-layer wiring layer which are electrically connected through a plurality of via structures in an interlayer insulation layer, and the second substrate has a number of via structures per interlayer insulation layer which is set greater than a number of via structures per interlayer insulation layer of the first substrate.

5. The printed wiring board according to claim 1, wherein the first substrate and the second substrate are positioned with a gap such that the first substrate and the second substrate are positioned without contacting with each other, and the gap between the first substrate and the second substrate is at least partly filled with a resin.

6. The printed wiring board according to claim 5, further comprising an insulative material disposed on at least one of a top portion and a bottom portion of the resin, and the insulative material and the resin in the gap between the first substrate and the second substrate comprise a same material.

7. The printed wiring board according to claim 1, wherein at least one of the first substrate and the second substrate has at least one insulation layer comprising an inorganic material.

8. The printed wiring board according to claim 7, wherein the insulation layer of at least one of the first substrate and the second substrate has a cloth layer comprising the inorganic material.

9. The printed wiring board according to claim 1, wherein the first substrate has a plurality of insulation layers each comprising an inorganic material, the second substrate has a plurality of insulation layers each comprising an inorganic material, the plurality of insulation layers in the first substrate is set to have a greater number of layers than the plurality of insulation layers in the second substrate.

10. The printed wiring board according to claim 1, wherein at least a part of the conductors of the second substrate has a thickness which is made a same as or less than a thickness of the conductors of the first substrate.

11. The printed wiring board according to claim 1, further comprising at least one electronic component electrically connected to the conductors in at least one of the first substrate and the second substrate.

12. The printed wiring board according to claim 1, further comprising at least one electronic component electrically connected to at least one of the conductors of the second substrate.

13. A method for manufacturing a printed wiring board, comprising: providing a first substrate having a plurality of conductors including a conductor later formed on a surface of the first substrate; forming from a single substrate a plurality of second substrates each having a plurality of conductors including a conductor layer formed on a surface of the plurality of second substrates; forming an accommodation section which accommodates at least one of the second substrates in the first substrate; accommodating at least one of the second substrates in the accommodation section formed in the first substrate; forming an insulation layer comprising an insulative material such that the at least one of the second substrates is embedded in the first substrate and that the insulation lager covers the conductor layers formed on the surfaces of the first and second substrates; and forming on the insulation layer a wiring layer having a plurality of interlayer connection portions formed through the insulation layer such that the conductor layers formed on the surfaces of the first substrate and the at least one of the second substrates are directly and electrically connected through the wiring layer.

14. The method for manufacturing a printed wiring board according to claim 13, wherein prior to the accommodating, inspecting quality of the first substrate and each of the plurality of second substrates, and in the accommodating, at least one of the second substrates determined to be defect-free in the inspecting is accommodated in the accommodation section of the first substrate determined to be defect-free in the inspecting.

15. The method for manufacturing a printed wiring board according to claim 13, wherein in the forming of the accommodation section, the accommodation section is formed so as to have a space sufficient to allow alignment when accommodating the at least one of the second substrates.

16. The method for manufacturing a printed wiring board according to claim 13, wherein the forming of the wiring layer comprises forming a plating layer on the insulation layer.

17. The method for manufacturing a printed wiring board according to claim 13, wherein the forming of the insulation layer comprises laminating the insulative material and forming a plurality of vias, and the forming of the wiring layer comprises forming a plating layer in the vias and on the insulation layer.

18. The method for manufacturing a printed wiring board according to claim 13, further comprising forming a second insulation layer comprising an insulative material over the first substrate and the second substrate on an opposite side of the insulation layer such that the first substrate and the second substrate are sandwiched between the insulation layer and the second insulation layer.

19. The printed wiring board according to claim 1, wherein the wiring layer comprises a plating layer.

20. The printed wiring board according to claim 1, wherein the accommodation section of the first substrate is a hollow portion penetrating through the first substrate.

* * * * *